United States Patent [19]

Farrell

[11] Patent Number: 4,721,842
[45] Date of Patent: Jan. 26, 1988

[54] BEAM POSITION CORRECTION DEVICE

[75] Inventor: William J. Farrell, Flossmoor, Ill.

[73] Assignee: Ferranti Sciaky, Inc., Chicago, Ill.

[21] Appl. No.: 901,947

[22] Filed: Aug. 29, 1986

[51] Int. Cl.$^4$ .............................................. B23K 15/00
[52] U.S. Cl. .............................. 219/121 EU; 250/397
[58] Field of Search ................. 219/121 EU, 121 EV, 219/121 EW, 121 EB, 121 EM; 250/397, 491.1

[56] References Cited

U.S. PATENT DOCUMENTS

| | | | |
|---|---|---|---|
| 3,575,640 | 8/1976 | Boux et al. | 250/397 X |
| 3,864,597 | 2/1975 | Trotel | 219/121 EW X |
| 4,560,854 | 12/1985 | Domian et al. | 219/121 EW |
| 4,600,839 | 7/1986 | Ichihashi et al. | 250/397 X |

Primary Examiner—C. L. Albritton
Attorney, Agent, or Firm—Julius L. Solomon

[57] ABSTRACT

A method and apparatus for correcting the undeflected resting position of an electron beam which has been displaced from its previous resting position because of physical or positional changes in elements of the electron gun which is generating the electron beam. The electron beam is directed towards a detector which determines the direction and amplitude of the deviation along mutually perpendicular axes of the point of impingement of the electron beam from a given reference point. The signals generated by the detector, in cooperation with a computer-controlled deflection system of the electron gun, cause the beam to be displaced in a series of iterative steps to the reference point. The distance and direction of the beam from its resting position to the reference point is maintained in the memory of the computer.

7 Claims, 9 Drawing Figures

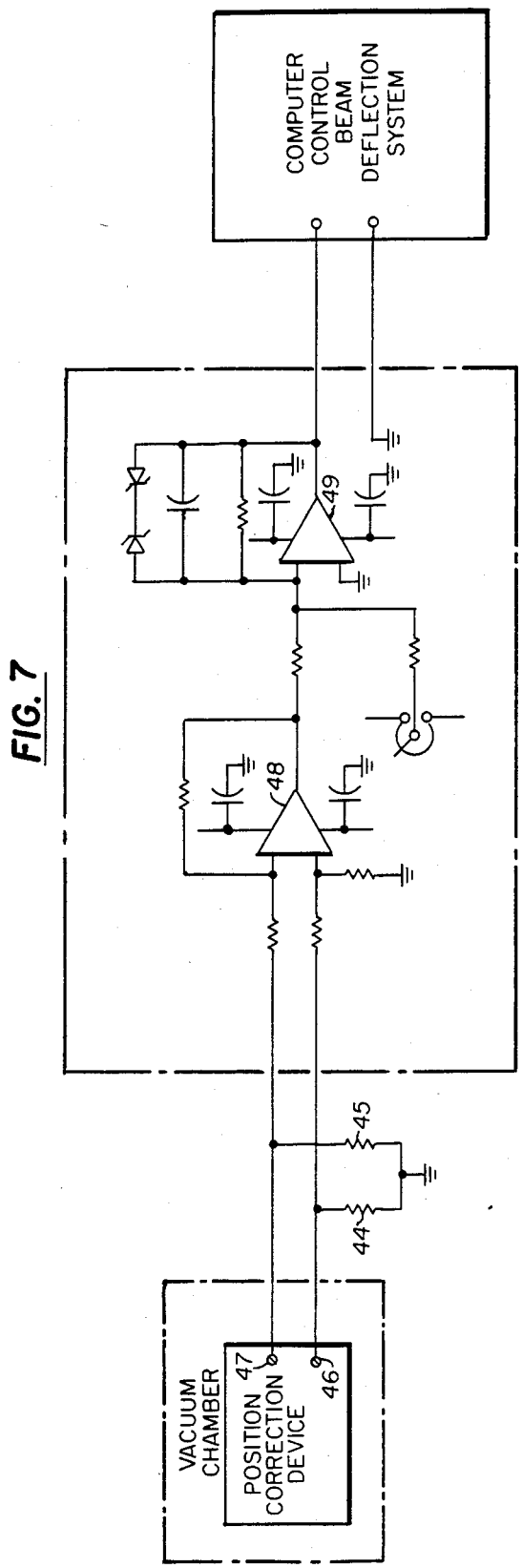
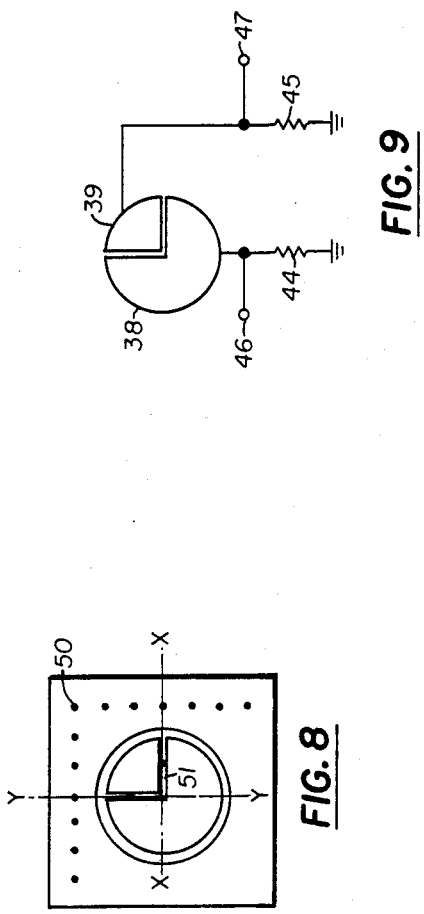
FIG. 7
FIG. 9
FIG. 8

BEAM POSITION CORRECTION DEVICE

This invention relates to an electron beam welding machine in which a beam of electrons generated in an electron gun mounted within a vacuum chamber is directed towards the workpieces which are to be welded along their abutting edges. The invention is directed more particularly to a method and means for determining the coordinates of the point on the surface of the workpiece upon which the undeflected electron beam emanating from the electron gun will strike that workpiece.

An electron beam welding machine is usually provided with means for moving the gun in relation to the workpiece so that the electron beam is caused to follow any path on the work along which it is desired that the beam impinge so as to produce a continuous weld along that line. This may be accomplished in several ways:

1. The gun may be supported on a mechanical arrangement which will move the gun along two mutually perpendicular axes with the work mounted stationary at a desired distance from the gun.
2. The gun may be fixed to the chamber with the work mounted on a moving carriage which allows for motion of the work along two axes which are mutually perpendicular.
3. The gun may be mounted so that it is moved along one axis (say, the "X" axis), with the work mounted on a carriage which is movable along a second axis (the "Y" axis) which is perpendicular to the "X" axis.

In order to make a proper weld, it is necessary that the gun be moved in relation to the work so that the impinging beam on the work follows the abutting surfaces to be welded. In the earliest electron beam welding machines, the relative motion of the gun to the work was controlled manually by means of two handwheels, one for the "X" axis and one for the "Y" axis, which were mounted near a viewing port of the machine. By turning the handwheels, the operator could make the beam follow the seam after having manually directed the beam to the starting point of the weld seam. This process was a slow and tedious one and allowed for only a very slow welding speed when welding along any path other than a straight line.

Later, as the electron beam process became more useful to industry, numerical controls were developed to control the relative motion between the gun and the work so that optimum welding speeds could be utilized when welding along contoured welding paths. And later, highly developed computer controls were utilized to control all the functions and parameters of the welding process. In all these newly developed systems, the motion of the gun in relation to the workpiece could be precisely controlled time after time without error. However, there was one problem remaining which was due to the inherent properties of the electron beam gun, and this was caused by the shift in the position of the beam on the work surface due to:

1. Changes in beam current
2. Changes in bias voltage
3. Changes in filament position:
    a. With time
    b. When filament is replaced This shift in the position of the electron beam may result in spoilage of the workpiece due to incomplete welds, which cannot always be corrected by reworking. If the electron beam machine is used for surface heat treating, a shift in the position of the beam impingement point on the work will shift the surface which is being heat treated and may lead to a shortened life or destruction of a machine upon which the piecepart is utilized.

It is the object of this invention to provide a method and means for determining the position of the point of impingement of an electron beam upon a work surface with respect to the electron gun which is generating that electron beam.

A further object is to provide a method and means for correcting for the change in position of the electron beam automatically.

Another object is to provide a means for periodically determining the point of impingement of the beam on the work and correcting the position to the desired point. Another object is to provide a means for determining the point of impingement of an electron beam upon a work surface utilizing the values of electron beam current and accelerating potential which are to be used in the actual welding operation.

Another object is to provide a method and means for determining the point of impingement of an electron beam upon a work surface which does not melt or overheat the work surface at the point of impingement.

Another object is to provide a method and means for automatically and rapidly directing an electron beam to a desired reference point.

BRIEF DESCRIPTION OF DRAWINGS

To illustrate the method and apparatus utilized, we may refer to the following figures:

FIG. 7 is a schematic drawing of an electrical circuit utilized in the electron beam position correction device.

FIG. 8 illustrates the successive movements of the electron beam during a determination of electron beam position.

FIG. 9 shows the electrical circuit for measuring the electron currents falling upon the separate sectors of the detector.

FIGS. 1 and 2 illustrate the arrangement of a moving gun and a moving carriage which would be utilized in the vacuum chamber of a typical electron beam welding machine wherein the electron gun (32) is movable on an "X-X" axis, being positioned above the carriage (2) which supports the workpieces (3) to be welded. The carriage (2) is provided with roller bearing devices (4) which ride on the rails (5) positioned at right angles to the movement of the gun so that the carriage thus moves along a "Y-Y" axis. A beam position detector (6) is positioned on the carriage (2) along with a beam dump (7), as indicated on the right side of FIGS. 1 and 2. Electrical connections are made between the position detector device and a position control system (9) by means of electrical conductors (8). The workpieces (3) are shown mounted on the carriage (2) with their abutting edges (10) in contact along the desired line of weld.

FIG. 3 illustrates in schematic form the general arrangement of the principal elements of an electron beam gun and its associated electrical supplies. The elements of an electron beam gun consist of a filament (15), cathode (16), anode (17), focus coil (24), deflection coils (25) and their associated supplies (20), (21), (22) and (23). Filament current supply (20) delivers current to filament (15), and brings the temperature of the filament to the level at which it is in condition to deliver electrons. The high-voltage power supply (22) applies a potential of 60,000 volts to anode (17) with respect to the filament (15) to cause the electrons to be accelerated towards the anode and through an aperture in the anode so as to form a beam of electrons moving at a velocity which may approach the speed of light. The cathode (16) and anode (17) are shaped in such a manner as to create an electrostatic field between the anode and the cathode which causes the electron beam to be directed towards a point a short distance outside of the anode. An adjustable D.C. power supply (21) of approximately 2,000 volts is applied between the filament and the cathode and by this means the intensity of the electron beam current may be controlled. Increasing the negative potential (or bias) on the cathode with respect to the filament reduces the electron beam current and vice versa. Beyond the opening in the anode there exists a field free space through which the beam passes through the focus coil (24) where it is focused to a desired spot on a workpiece by adjusting the current applied to the focus coil by a power supply (23). Directly below the focus coil (24) the deflection coils (25) generate magnetic fields which may be adjusted in intensity so as to cause the beam to be deflected along two axes which are mutually perpendicular and thus direct the beam to impinge upon a desired point on the work. The output of all the various current and voltage supplies for the electron beam gun may be controlled by a computer, and all may be programmed so that these values may be modified and varied so that the electron beam is caused to describe a preset pattern on the surface of the work in a given time and to repeat the pattern as needed.

Referring to FIG. 4, which illustrates the complete system for an electron beam welding or heat treating machine incorporating the invention, we may note the electron beam gun (32) fitted with a focus coil (24) for focusing the electron beam on the work and deflection coils (25) for deflecting the beam along two mutually perpendicular axes so that the beam strikes the work to be welded or heat treated in accordance with a predetermined program which has previously been placed in the memory of the computer control (28) by the system operator. The workpiece (3) is mounted upon the carriage (2) within a vacuum chamber (35) which is maintained at a low pressure suitable for the electron beam process by vacuum pumping system (31). The motion of carriage (2) is effected along several axes of required motion by means of servo motor (33) which is controlled by servo drive (34). The motor positions the carriage within the chamber so that the work will be properly positioned with respect to the resting position of the electron beam (36) which is deflected by the action of the magnetic fields of the "X" and "Y" axis deflection coils which are under control of beam deflection amplifiers (29), which in turn are controlled by information previously stored in the computer controlled memory. Computer (28) not only controls the beam deflecting programs, but also controls the electron beam gun parameters of accelerating potential, beam current and focus coil current, as well as the vacuum pumping system and the servo drives which are utilized to position in sequence a batch of parts supported by a suitable holding fixture within the chamber. FIGS. 5 and 6 illustrate, in top view and end view sections, respectively, the mechanical arrangement for the beam position detector. The device comprises a main body (37) which serves as a heat sink which is fabricated from a material such as copper which has a high heat capacity and which supports two parts (38) and (39) made of a machinable refractory alloy which comprise the elements of the beam position detector proper. Elements (38) and (39) are sectors of a circular cylinder which are separated into two sectors, a 270-degree sector and a 90-degree sector, which are separated and electrically insulated one from the other and from the main body (37) by a gap of several thousandths of an inch. Sectors (38) and (39) are fastened to the main body (37) by screw (40) which are insulated from the main body by insulators (41), (42) and (43). Means are provided for making electrical connection to segments (38) and (39) through the screws 40). In practical operation, the device is mounted so that the "X" and "Y" axes of the beam detector are aligned with the motion of the carriage and the electron gun during the welding operation. The detector is assembled with a 0.03 inch gap between parts (38) and (39) and is mounted in a fixed position upon the carriage so that the "X" and "Y" coordinates at the center of the detector; that is, the point where the center of the slot along the "X" axis intersects the center of the slot along the "Y" axis, may be used as a reference point. The "X" and "Y" coordinates of a line of weld on workpieces which are mounted on the carriage may then be referred to with respect to the point of reference on the detector. In previous attempts to define the resting position of an electron beam, the full power of the beam was directed toward the detector. Inasmuch as the power in the beam, having a size of perhaps one-sixteenth of an inch in diameter, may be 15 kilowatts, the detectors were destroyed when a measurement was attempted because of the intense heating and consequent melting of the detector. In order to avoid the melting of the detector, the current was reduced to a small fraction of the available power to a level which would not cause melting of the detector. However, it was found that when the current was later brought up to the current required for welding, the beam had shifted, making this method unsatisfactory.

Figure 1:
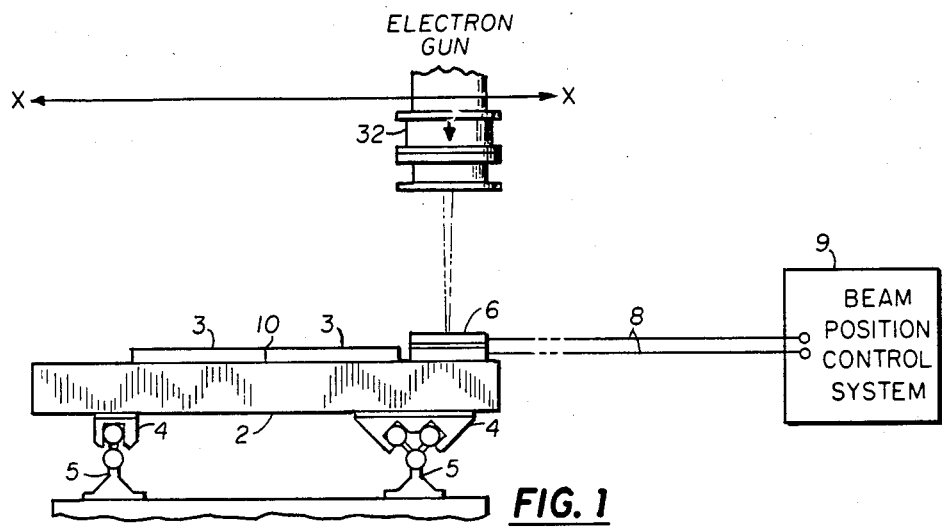
FIG. 1 is an end elevational view of an electron gun and carriage combination including the mechanical apparatus on the carriage utilized in determining the position of the electron beam.
Figure 2:
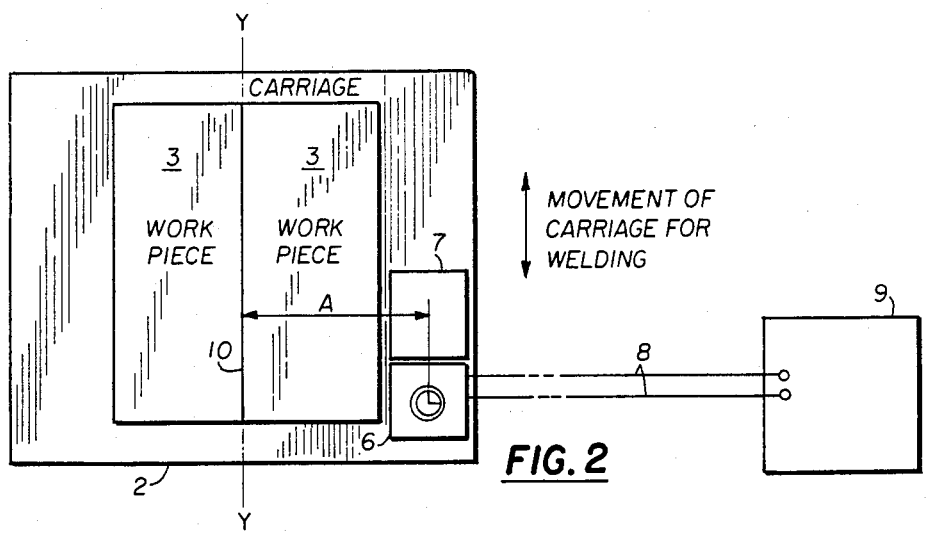
FIG. 2 is a top plan view of FIG. 1.
Figure 3:
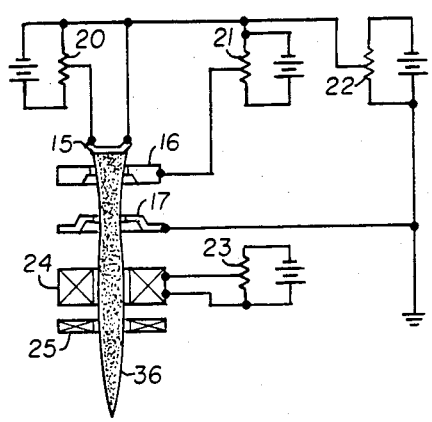
FIG. 3 is a schematic drawing showing the elements of an electron beam gun.
Figure 4:
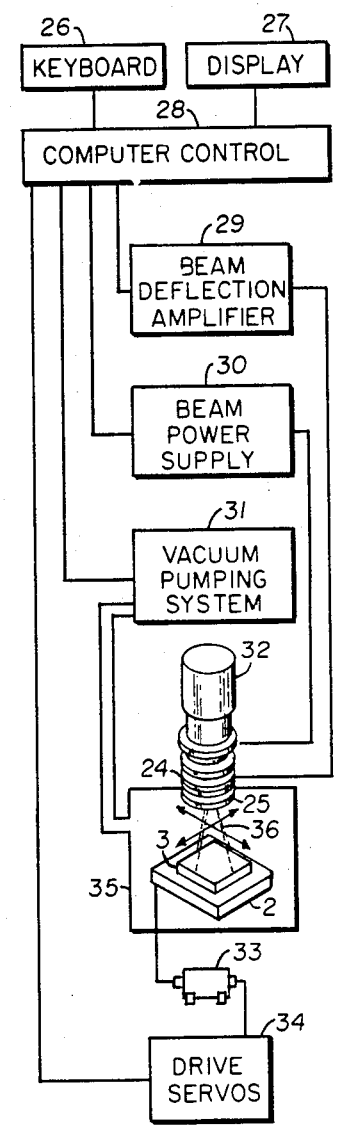
FIG. 4 is a block diagram showing the essential elements of an electron beam welding machine incorporating the invention.
Figure 5:
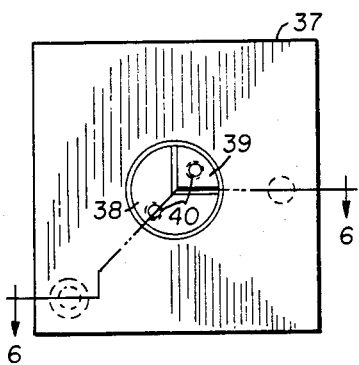
FIG. 5 is a top view of the mechanical parts of a detector arrangement utilized in practicing the invention.
Figure 6:
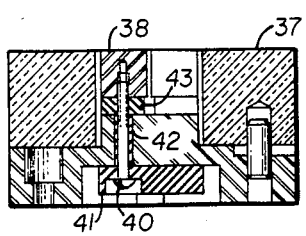
FIG. 6 illustrates the mechanical parts of a detector in a sectional end view.

The present method, in order to avoid the above difficulties, utilizes a novel time-sharing of the electron beam between a relatively large heat sink and the detector, and because of this, allows for the measurement of the beam position to be made without damage to the detector, although the beam current is set at the working current level which may be at a level of 100 KW. The sampling method utilized is illustrated in FIG. 8. The beam is deflected step-wise to a series of points (50) along a line which is perpendicular to the "X" axis and which is bisected by the "X" axis. At the "X" axis, the beam is deflected to a point along the "X" axis; that is, along the gap (51) between the parts (38) and (39) of the detector. The beam is allowed to dwell at each of the points for a short period of time which is adjustable, let us say, for a dwell time of 75 microseconds. If the beam is allowed to dwell at nine points on the heat sink and one point along the "X" axis, it has been found there will be no damage to parts (38) and (39) although the power in the beam may be as high as 100 kilowatts. Utilizing this method, therefore, of rapidly deflecting the beam from point to point and allowing the beam to dwell for a very short period at each point, it is possible to make a determination of the position of the beam with respect to the center line of the gaps along the "X" and the "Y" axes. The determination as to whether the beam is centered over the gaps is made by measuring the current which is delivered by the electron beam to the elements (38) and (39) shown on FIG. 9. These elements are connected to electrical resistors (44) and (45), which carry the beam current from the element (38) or (39) through the resistor (44) or (45) respectively. If the voltage developed across resistor (44) equals that which is developed across resistor (45), then it follows that the current is being evenly divided between elements (38) and (39) and therefore that the beam is centered over the gap between these two elements. If no voltage is measured across resistor (45), then we know that the beam is falling upon (38) with no part of the beam falling on (39). If there is no voltage developed across resistor (44), then we know the beam is directed to element (39) with no part of the beam striking element (38). By deflecting the beam step-wise along a line which is perpendicular to the "Y" axis and deflecting the beam periodically along the "Y" axis we can determine whether the beam is positioned along the "Y" axis. By repeating the operation of stepping the beam and sampling along the "X" and the "Y" axes we can determine by the voltages across resistors (44) and (45) whether the beam is or is not striking the reference point of the detector. If the voltages developed across resistors (44) and (45) are equal, then we know that the beam is striking the detector at the reference point. By feeding these voltages to suitable control circuits, we can go a step further and develop currents which are fed to the deflection coils of the electron gun, which will move the beam to the desired reference point.

Segments (38) and (39) of the position correction device are connected to electrical terminals (46) and (47) respectively, mounted on a device within the vacuum chamber. Electrical connections are made from these terminals (46) and (47) to an electrical circuit mounted outside the vacuum chamber and shown in FIG. 7 which has the function of amplifying the signals developed across the resistors (44) and (45). The voltage developed across the resistors (44) and (45) is applied to the two input terminals of the differential amplifier (48), whose output will be either zero if the voltage across (44) equals the voltage across (45), positive if the voltage across (44) is greater than the voltage across (45), or negative if the voltage across (45) is greater than the voltage across (44). The voltage developed at the output of amplifier (48) is applied to the electrical integrator circuit (49) and the output voltage from the integrator circuit is applied to the electrical circuit which controls the currents which are applied to the deflection coils of the electron beam gun, and acts in such a way that the electron beam is deflected to the position at which the electron beam is distributed equally between segment (38) and segment (39). This is done in a series of steps of sampling the beam as described above, first in the "X" direction and then in the "Y" direction, until the beam is directed to the reference point at the center of the position correction device. In practice, the correct position of the beam is found in approximately one-quarter to one-half second by repeatedly sampling the position along the "X" axis and then the "Y" axis by the use of the stepped displacement of the beam from one spot to the next on the heat sink and then sampling by displacement onto the position correction sectors. The stepped motion of the beam from spot to spot is controlled by instructions which are stored in the computer which controls the overall function of the electron beam machine. The deflection information which is developed during the sampling operation is also stored in computer memory until a succeeding sampling operation. A sampling operation may be initiated by the machine operator whenever it is deemed desirable. For example, when there is a change required in the beam current to be delivered, after the replacement of a filament, or after a long period of use of the same filament. Through the use of the beam position sensing device in association with the feedback means for controlling the deflection apparatus of the electron gun, the beam is rapidly caused to be directed to strike at a desired reference point automatically and without causing any damage to the sensing detector device, although the actual current required to perform a desired welding or heat treating operation with the electron beam is utilized. The invention is not to be limited to or by details of construction of a particular embodiment illustrated by the drawings, as various other forms of the device will of course be apparent to those skilled in the art without departing from the spirit of the invention or the scope of the claims.

What is claimed is:

1. A method of positioning an electron beam upon a given reference point on a detector comprising a 270° sector and a 90° sector of a cylinder separated by a fixed gap between the straight portions of the sectors towards which the beam is directed, comprising the steps of:
    generating an electron beam of a desired current intensity;
    directing the said beam towards and focusing the said beam upon the surface of the said sectors, the radial portions of which are aligned along coordinate axes which are mutually perpendicular;
    causing the beam to impinge upon a series of closely spaced points upon a heat sink proximate to said sectors along a line parallel to one of said axes;
    causing the beam to be directed at right angles intermittently along the second of said coordinate axes and onto the said sectors so as to sample the currents collected by each of said sectors;
    determining the difference in the electron beam current reaching each sector;
    causing the electron beam to be deflected in a direction towards the sector which has collected the lesser current;
    repeating the above series of steps until the said difference in current reaches zero; and
    repeating the process of sampling the current reaching the two sectors along the line parallel to the second axis until the currents reaching the sectors are equal along both axes.

2. A method in accordance with claim 1 in which the currents reaching each sector are amplified in a differential amplifier whose output is then integrated over the length of the sampling period.

3. A method in accordance with claim 2 in which the said integrated output is directed to a deflection control system amplifier and deflection coil which positions the beam along one of two coordinate axes.

4. A method in accordance with claim 2 in which a computer control is programmed so that the integrated output is directed to a deflection control system for the axis which is being sampled.

5. A method in accordance with claim 4 in which the coordinates of the displacement of the impingement point of the beam from a predetermined reference point are maintained in computer control memory.

6. Apparatus for directing an electron beam to fall upon a given reference point comprising a beam position pickup consisting of two sectors upon which the electron beam impinges, a heat sink associated with each of said sectors, means for deflecting the beams intermittently from the said heat sinks to its undeflected position and allowing the beam to rest at said position for a preset period of time, and means for measuring each of the electron beam currents passing through said sectors; means for measuring the electron beam currents passing through the pickup, means for amplifying the said currents, means for integrating the difference between the said currents, and means for causing the last said difference current to control the deflection of the said electron beam along two mutually perpendicular axes in turn.

7. Apparatus in accordance with claim 6 in which computer means are provided for selecting the axis along which a beam impingement point is to be corrected, and means associated with said computer means for electrically connecting the said integrated signals to a deflection amplifier and coil system which will cause the beam to be deflected in the selected direction.

* * * * *